US012009188B2

(12) United States Patent
Liu et al.

(10) Patent No.: US 12,009,188 B2
(45) Date of Patent: Jun. 11, 2024

(54) ROTATABLE FARADAY CLEANING APPARATUS AND PLASMA PROCESSING SYSTEM

(71) Applicant: JIANGSU LEUVEN INSTRUMENTS CO., LTD, Jiangsu (CN)

(72) Inventors: Haiyang Liu, Jiangsu (CN); Dongdong Hu, Jiangsu (CN); Xiaobo Liu, Jiangsu (CN); Na Li, Jiangsu (CN); Shiran Cheng, Jiangsu (CN); Song Guo, Jiangsu (CN); Zhihao Wu, Jiangsu (CN); Kaidong Xu, Jiangsu (CN)

(73) Assignee: JIANGSU LEUVEN INSTRUMENTS CO., LTD, Jiangsu (CN)

( * ) Notice: Subject to any disclaimer, the term of this patent is extended or adjusted under 35 U.S.C. 154(b) by 242 days.

(21) Appl. No.: 17/626,496

(22) PCT Filed: Feb. 28, 2020

(86) PCT No.: PCT/CN2020/077309
§ 371 (c)(1),
(2) Date: Jan. 12, 2022

(87) PCT Pub. No.: WO2021/134890
PCT Pub. Date: Jul. 8, 2021

(65) Prior Publication Data
US 2022/0297168 A1 Sep. 22, 2022

(30) Foreign Application Priority Data
Dec. 31, 2019 (CN) .......................... 201911413106.3

(51) Int. Cl.
H01J 37/32 (2006.01)
B08B 9/00 (2006.01)
B08B 13/00 (2006.01)

(52) U.S. Cl.
CPC .......... *H01J 37/32862* (2013.01); *B08B 9/00* (2013.01); *B08B 13/00* (2013.01); *H01J 2237/334* (2013.01)

(58) Field of Classification Search
CPC ........... H01J 37/32862; H01J 37/32651; H01J 37/3288; B08B 9/00; B08B 1/32; B08B 13/00
See application file for complete search history.

(56) References Cited

U.S. PATENT DOCUMENTS 5,685,942 A 11/1997 Ishii
2005/0126711 A1* 6/2005 Kazumi ............ H01J 37/32082
156/345.48

(Continued)

FOREIGN PATENT DOCUMENTS

CN 101402095 4/2009
CN 110223904 9/2019
CN 110491760 11/2019

OTHER PUBLICATIONS

"International Search Report (Form PCT/ISA/210) of PCT/CN2020/077309," mailed on Sep. 21, 2020, with English translation thereof, pp. 1-4.

(Continued)

Primary Examiner — Aiden Lee
(74) Attorney, Agent, or Firm — JCIPRNET

(57) ABSTRACT

The present invention provides a rotatable faraday cleaning apparatus and a plasma processing system, said apparatus comprising a cavity cover, a motor, an eccentric wheel, a long-petalled assembly, a coupling window, a gas intake nozzle, a connecting rod, a short-petalled assembly, a first sector-shaped conductor, and a second sector-shaped conductor; the cavity cover is assembled on a reactor cavity main body, the coupling window is mounted on the cavity cover, the gas intake nozzle is provided on the coupling (Continued)

window, the first sector-shaped conductor is assembled on the gas intake nozzle, the second sector-shaped conductor is assembled on the gas intake nozzle, the long-petalled assembly is assembled on the gas intake nozzle, the short-petalled assembly is assembled on the gas intake nozzle, the connecting rod is assembled on the long-petalled assembly, the eccentric wheel is assembled on the connecting rod, and the motor is mounted on the eccentric wheel.

6 Claims, 3 Drawing Sheets

(56) References Cited

U.S. PATENT DOCUMENTS

| | | | |
|---|---|---|---|
| 2008/0283500 A1* | 11/2008 | Motokawa | H01J 37/321 |
| | | | 216/68 |
| 2014/0116335 A1 | 5/2014 | Tsuji et al. | |
| 2015/0191823 A1* | 7/2015 | Banna | H05B 6/02 |
| | | | 219/635 |
| 2016/0049279 A1* | 2/2016 | Suh | H01J 37/3211 |
| | | | 156/345.48 |

OTHER PUBLICATIONS

"Written Opinion of the International Searching Authority (Form PCT/ISA/237) of PCT/ CN2020/077309," mailed on Sep. 21, 2020, pp. 1-3.

* cited by examiner

ROTATABLE FARADAY CLEANING APPARATUS AND PLASMA PROCESSING SYSTEM

CROSS-REFERENCE TO RELATED APPLICATION

This application is a 371 of international application of PCT application serial no. PCT/CN2020/077309, filed on Feb. 28, 2020, which claims the priority benefit of China application no. 201911413106.3, filed on Dec. 31, 2019. The entirety of each of the above mentioned patent applications is hereby incorporated by reference herein and made a part of this specification.

BACKGROUND

Technical Field

The present invention relates to a rotatable faraday cleaning apparatus and plasma processing system, and belongs to the field of ICP cavity cleaning technologies.

Description of Related Art

In processes of manufacturing semiconductor integrated circuits, etching is one of the most important procedures. Plasma etching is one of the commonly used etching methods. Generally, etching occurs in a vacuum reactor cavity, and the vacuum reactor cavity generally includes an electrostatic chuck, configured to implement functions such as carrying and attracting wafers and radio frequency loads and cooling wafers.

In the past, inductively coupled plasma (ICP) reactor cavities were often used during etching of semiconductor integrated circuits. However, during production, the interiors of a coupling window often cannot be cleaned because there are a large number of dead angles, and the conventional reactor cavities are fixedly mounted, which is inconvenient for comprehensive cleaning of the interior. The existing ICP reactor cavities are inconvenient to clean. A rotatable faraday cleaning apparatus and plasma processing system is now urgently needed to resolve the foregoing problems.

SUMMARY

To overcome the shortcomings of the prior art, an objective of the present invention is to provide a rotatable faraday cleaning apparatus and plasma processing system, to resolve the problems raised in BACKGROUND. The present invention has a proper structure, and facilitates effective cleaning of ICP reactor cavities and comprehensive cleaning.

To achieve the foregoing objectives, the present invention adopts the following technical solutions: A rotatable faraday cleaning apparatus and plasma processing system is provided, including a reactor cavity main body, a bias electrode, and a rotatable cleaning mechanism, where the bias electrode is mounted at a lower side inside the reactor cavity main body, and the rotatable cleaning mechanism is disposed at an upper side inside the reactor cavity main body; the rotatable cleaning mechanism includes a cavity cover, a motor, an eccentric wheel, a long-petalled assembly, a coupling window, a gas intake nozzle, a connecting rod, a short-petalled assembly, a first sector-shaped conductor, and a second sector-shaped conductor, where the cavity cover is assembled at an upper side of the reactor cavity main body, the coupling window is mounted at an inner side of the cavity cover, the gas intake nozzle is provided at a central part of the coupling window, the first sector-shaped conductor and the second-shaped conductor are assembled at an outer side of the gas intake nozzle, the long-petalled assembly and the short-petalled assembly are assembled at the outer side of the gas intake nozzle, the connecting rod is assembled at a left side of the long-petalled assembly, the eccentric wheel is assembled at a front side of the connecting rod, and the motor is mounted at an upper side of the eccentric wheel.

Further, a rotating shaft is assembled on an annular side surface of the gas intake nozzle, and inner sides of the long-petalled assembly and the short-petalled assembly are connected to the rotating shaft.

Further, hinges are assembled on front and rear sides of the connecting rod, the front side of the connecting rod is connected to the eccentric wheel by the hinge, and the rear side of the connecting rod is connected to the long-petalled assembly by the hinge.

Further, the bias electrode, the first sector-shaped conductor, the second sector-shaped conductor, and the motor are all connected to an external power supply through wires.

Further, the long-petalled assemblies which have a number of four have a same specification and the short-petalled assemblies which have a number of four have a same specification, and four long-petalled assemblies and four short-petalled assemblies are evenly distributed at the outer side of the gas intake nozzle.

Further, a sealing cover is assembled at an upper side of the cavity cover, and a rubber gasket is assembled at a lower side of the sealing cover.

Beneficial effects of the present invention: The present invention provides a rotatable faraday cleaning apparatus and plasma processing system. A cavity cover, a motor, an eccentric wheel, a long-petalled assembly, a coupling window, a gas intake nozzle, a connecting rod, a short-petalled assembly, a first sector-shaped conductor, and a second sector-shaped conductor are added to the present invention. Therefore, such a design enables effective rotatable cleaning of ICP reactor cavities, thereby resolving the problem that the existing ICP reactor cavities are inconvenient to clean, and improving the cleaning convenience of the present invention.

A rotating shaft is assembled on an annular side surface of the gas intake nozzle, and inner sides of the long-petalled assembly and the short-petalled assembly are connected to the rotating shaft. Therefore, such a design enables effective rotation of the long-petalled assembly and the short-petalled assembly, so as to clean the surface of the coupling window more evenly. Hinges are assembled on front and rear sides of the connecting rod, the front side of the connecting rod is connected to the eccentric wheel by the hinge, and the rear side of the connecting rod is connected to the long-petalled assembly by the hinge. Therefore, such a design avoids incomplete cleaning of the internal dead corners of the coupling window. The bias electrode, the first sector-shaped conductor, the second sector-shaped conductor, and the motor are all connected to an external power supply through wires. Therefore, such a design enables the reactor cavity main body to effectively work. A sealing cover is assembled at an upper side of the cavity cover, and a rubber gasket is assembled at a lower side of the sealing cover. Therefore, such a design effectively implements sealing and dust proofing. The present invention has a proper structure, and facilitates effective cleaning of ICP reactor cavities and comprehensive cleaning.

BRIEF DESCRIPTION OF THE DRAWINGS

Other features, objectives, and advantages of the present invention become more apparent through reading the detailed descriptions on the non-limitative embodiments made with reference to the following accompanying drawings.

In the figures: 1. reactor cavity main body, 2. bias electrode, 3. rotatable cleaning mechanism, 31. cavity cover, 32. motor, 33. eccentric wheel, 34. long-petalled assembly, 35. coupling window, 36. gas intake nozzle, 331. connecting rod, 341. short-petalled assembly, 361. first sector-shaped conductor, 362. second sector-shaped conductor.

DESCRIPTION OF THE EMBODIMENTS

To make the technical means, inventive features, and achieved objectives and effects of the present invention comprehensible, the present invention will be further explained below with reference to specific implementations.

Figure 1:
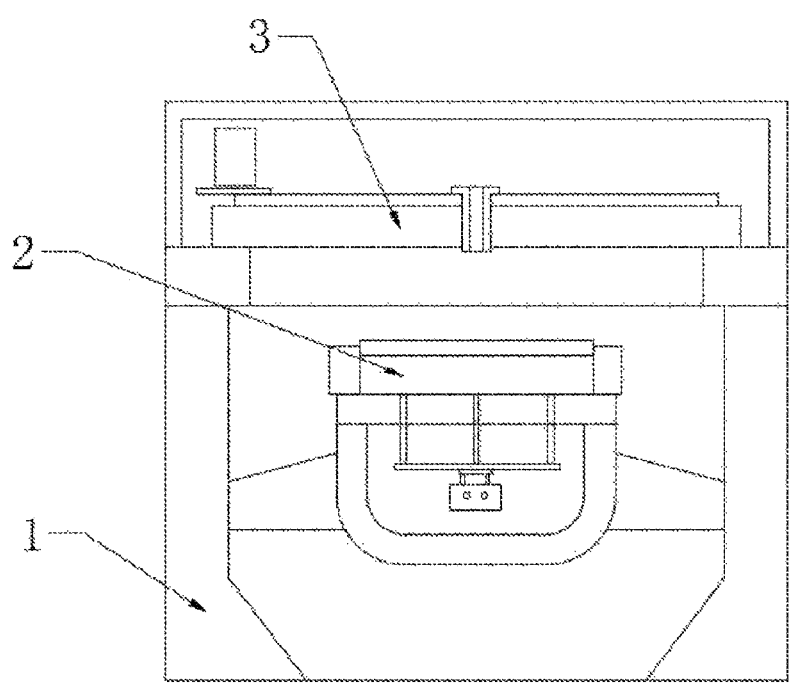
FIG. 1 is a schematic structural diagram of a rotatable faraday cleaning apparatus and plasma processing system according to the present invention.
Figure 2:
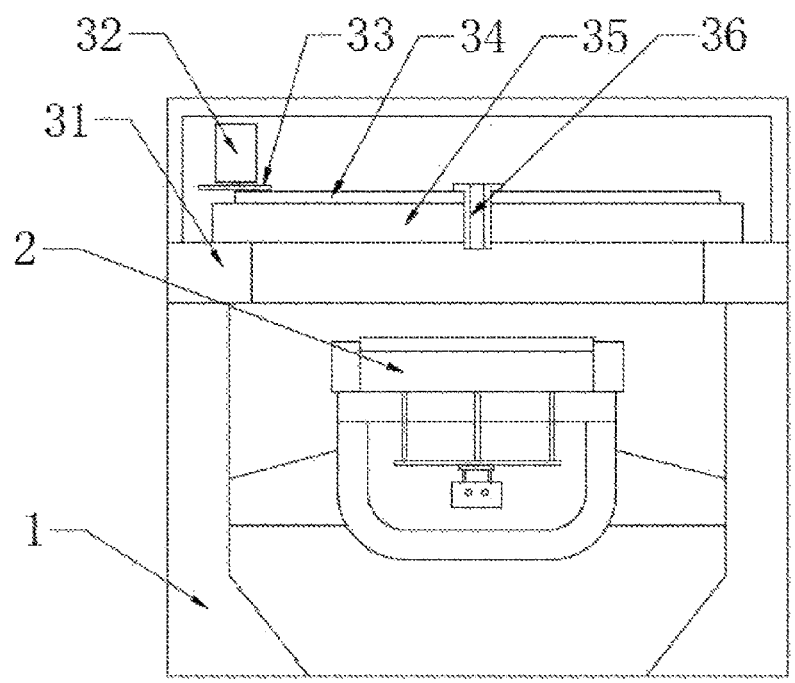
FIG. 2 is a schematic structural diagram of a rotatable cleaning mechanism in a rotatable faraday cleaning apparatus and plasma processing system according to the present invention.
Figure 3:
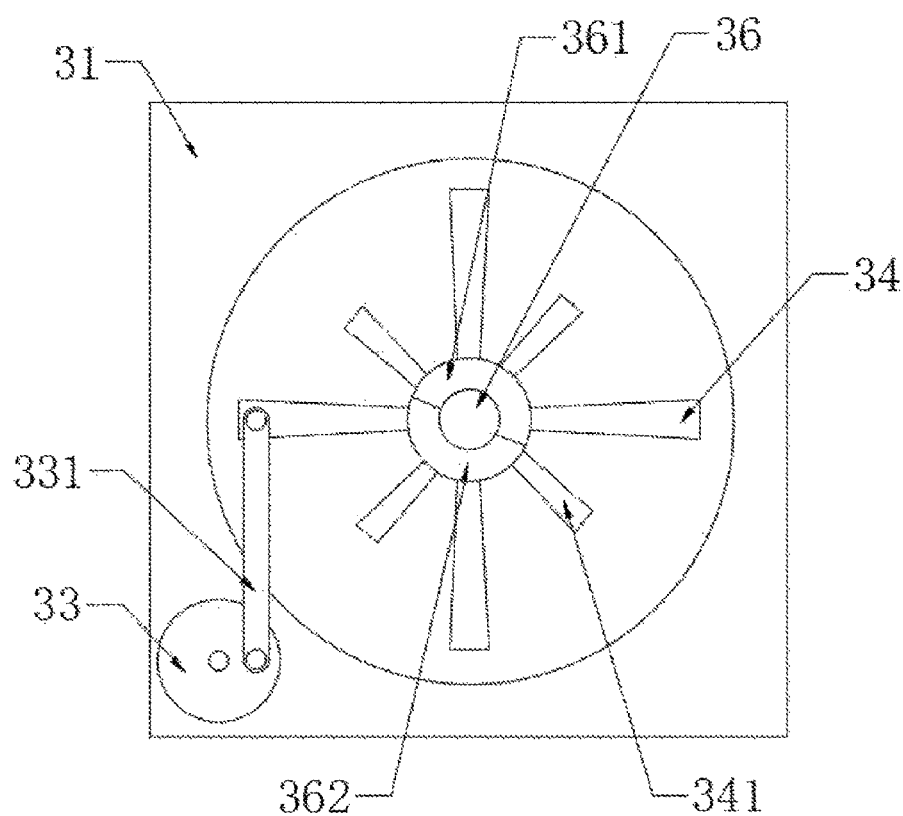
FIG. 3 is a top view of a coupling window in a rotatable faraday cleaning apparatus and plasma processing system according to the present invention.

With reference to FIG. 1 to FIG. 3, the present invention provides a technical solution: A rotatable faraday cleaning apparatus and plasma processing system is provided, including: a reactor cavity main body 1, a bias electrode 2, and a rotatable cleaning mechanism 3. The bias electrode 2 is mounted at a lower side inside the reactor cavity main body 1, and the rotatable cleaning mechanism 3 is disposed at an upper side inside the reactor cavity main body 1.

The rotatable cleaning mechanism 3 includes a cavity cover 31, a motor 32, an eccentric wheel 33, a long-petalled assembly 34, a coupling window 35, a gas intake nozzle 36, a connecting rod 331, a short-petalled assembly 341, a first sector-shaped conductor 361, and a second sector-shaped conductor 362. The cavity cover 31 is assembled at an upper side of the reactor cavity main body 1. The coupling window 35 is mounted at an inner side of the cavity cover 31. The gas intake nozzle 36 is provided at a central part of the coupling window 35. The first sector-shaped conductor 361 is assembled at an outer side of the gas intake nozzle 36. The second sector-shaped conductor 362 is assembled at the outer side of the gas intake nozzle 36. The long-petalled assembly 34 is assembled at the outer side of the gas intake nozzle 36. The short-petalled assembly 341 is assembled at the outer side of the gas intake nozzle 36. The connecting rod 331 is assembled at a left side of the long-petalled assembly 34. The eccentric wheel 33 is assembled at a front side of the connecting rod 331. The motor 32 is mounted at an upper side of the eccentric wheel 33. Such a design resolves the problem that the existing ICP reactor cavities are inconvenient to clean.

A rotating shaft is assembled on an annular side surface of the gas intake nozzle 36, and inner sides of the long-petalled assembly 34 and the short-petalled assembly 341 are connected to the rotating shaft. Such a design enables effective rotation of the long-petalled assembly 34 and the short-petalled assembly 341, so as to clean the surface of the coupling window 35 more evenly. Hinges are assembled on front and rear sides of the connecting rod 331, the front side of the connecting rod 331 is connected to the eccentric wheel 33 by the hinge, and the rear side of the connecting rod 331 is connected to the long-petalled assembly 34 by the hinge. Such a design avoids incomplete cleaning of the internal dead corners of the coupling window 35.

The bias electrode 2, the first sector-shaped conductor 361, the second sector-shaped conductor 362, and the motor 32 are all connected to an external power supply through wires. Such a design enables the reactor cavity main body 1 to effectively work. The long-petalled assemblies 34 and the short-petalled assemblies 341 are evenly distributed, four long-petalled assemblies 34 with the same specifications are disposed, and four short-petalled assemblies 341 with the same specifications are disposed. Such a design enables the long-petalled assemblies 34 and the short-petalled assemblies 341 to rotate around a central axis of the motor 32 back and forth by specific angles during operation of the motor 32, to facilitate comprehensive cleaning. A sealing cover is assembled on an upper side of the cavity cover 31, and a rubber gasket is assembled at a lower side of the sealing cover. Such a design effectively implements sealing and dust proofing.

In an embodiment of the present invention: The staff first connects the bias electrode 2 and the motor 32 inside the reactor cavity main body 1 to the external power supply through wires. The motor 32 works and drives the connecting rod 331 to deviate, which in turn drives the long-petalled assembly 34 and the short-petalled assembly 341 to rotate by specific angles, to facilitate cleaning of the lower side inside the coupling window 35. The bias electrode 2 works to enable the internal communication of the reactor cavity main body 1. After the first sector-shaped conductor 361 and the second sector-shaped conductor 362 are powered on, external ions are allowed to enter a lower side of coupling window 35, which is convenient for discharging dust inside the reactor cavity main body 1 along the gas intake nozzle 36, and cleaning the interiors of the coupling window 35, the cavity cover 31, and the reactor cavity main body 1 quickly and efficiently.

The basic principles and main features of the present invention and the advantages of the present invention are shown and described above. For persons skilled in the art, it is obvious that the present invention is not limited to the details of the foregoing exemplary embodiments. In addition, the present invention can be carried out in other specific forms without departing from the spirit or basic features of the present invention. Therefore, the embodiments should be regarded as exemplary and non-limitative from any point of view. The scope of the present invention is defined by the attached claim instead of the foregoing descriptions. Therefore, it is intended to include all variants within the meanings and scope of equivalent elements of the claims in the present invention. No reference sign in the claims shall be regarded as a limitation to the involved claims.

In addition, it should be understood that although this specification is described according to the implementations, not every implementation includes only one independent technical solution. The specification is described in this way only for clarity. Persons skilled in the art should regard the specification as a whole. The technical solutions in the embodiments may also be appropriately combined to form other implementations that can be understood by persons skilled in the art.

What is claimed is:

1. A rotatable faraday cleaning apparatus for a plasma processing system, comprising:

a reactor cavity main body;
a bias electrode mounted at a lower side inside the reactor cavity main body; and
a rotatable cleaning mechanism disposed at an upper side above the reactor cavity main body,
wherein the rotatable cleaning mechanism comprises:
- a cavity cover assembled at the upper side above the reactor cavity main body,
- a coupling window mounted at an upper side of the cavity cover,
- a gas intake nozzle provided at a central part of the coupling window,
- a long-petalled assembly and a short-petalled assembly assembled at an outer side of the gas intake nozzle,
- a first sector-shaped conductor and a second sector-shaped conductor assembled at the outer side of the gas intake nozzle,
- a connecting rod assembled at a left side of the long-petalled assembly,
- an eccentric wheel assembled at a front side of the connecting rod, and
- a motor mounted at an upper side of the eccentric wheel.

2. The rotatable faraday cleaning apparatus for the plasma processing system according to claim 1, wherein a rotating shaft is assembled on an annular side surface of the gas intake nozzle, and inner sides of the long-petalled assembly and the short-petalled assembly are connected to the rotating shaft.

3. The rotatable faraday cleaning apparatus for the plasma processing system according to claim 1, wherein hinges are assembled on the front side and a rear side of the connecting rod, the front side of the connecting rod is connected to the eccentric wheel by a first hinge of the hinges, and the rear side of the connecting rod is connected to the long-petalled assembly by a second hinge of the hinges.

4. The rotatable faraday cleaning apparatus for the plasma processing system according to claim 1, wherein the bias electrode, the first sector-shaped conductor, the second sector-shaped conductor, and the motor are all connected to an external power supply through wires.

5. The rotatable faraday cleaning apparatus for the plasma processing system according to claim 1, wherein a number of the long-petalled assemblies is four, all the long-petalled assemblies have a same specification, and a number of the short-petalled assemblies is four, all the short-petalled assemblies have a same specification, and the four long-petalled assemblies and the four short-petalled assemblies are evenly distributed at the outer side of the gas intake nozzle.

6. The rotatable faraday cleaning apparatus for the plasma processing system according to claim 1, wherein a sealing cover is assembled at an upper side of the cavity cover, and a rubber gasket is assembled at a lower side of the sealing cover.

* * * * *